(12) United States Patent
Gonzalez Diaz

(10) Patent No.: US 8,975,948 B2
(45) Date of Patent: Mar. 10, 2015

(54) WIDE COMMON MODE RANGE TRANSMISSION GATE

(71) Applicant: Texas Instruments Incorporated, Dallas, TX (US)

(72) Inventor: Sigfredo Emanuel Gonzalez Diaz, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 13/677,858

(22) Filed: Nov. 15, 2012

(65) Prior Publication Data

US 2014/0132331 A1  May 15, 2014

(51) Int. Cl.
*H03K 17/284* (2006.01)
*H03K 17/082* (2006.01)

(52) U.S. Cl.
CPC .................... *H03K 17/0822* (2013.01)
USPC ........................... 327/399; 327/394

(58) Field of Classification Search
USPC .................. 327/392–394, 398, 399, 407, 427
See application file for complete search history.

(56) References Cited

U.S. PATENT DOCUMENTS 3,215,859 A   11/1965  Sorchych
6,522,187 B1 *  2/2003  Sousa ........................... 327/391

FOREIGN PATENT DOCUMENTS

JP           H02172319         7/1990

* cited by examiner

*Primary Examiner* — Hai L Nguyen
(74) *Attorney, Agent, or Firm* — Alan A. R. Cooper; Frederick J. Telecky, Jr.

(57) ABSTRACT

A transmission gate self-biases its transistors to provide a constant gate biasing that provides a consistent path for an input signal to be cleanly passed to the gate's output and protects the transistors' gate oxide in cases of high input signals. An array of matched transistors are arranged to be biased by a voltage input node and with a current source configured to provide a bias current across individual transistors of the array of matched transistors. A current sink is configured to sink the bias current across the individual transistors to set a bias voltage at a voltage input node to a multiple of a gate-to-source voltage for the individual transistors of the array of matched transistors. A different set of transistors is configured to provide a signal path for an analog input signal.

9 Claims, 4 Drawing Sheets

WIDE COMMON MODE RANGE TRANSMISSION GATE

TECHNICAL FIELD

This invention relates generally to transmission gate circuits.

BACKGROUND

Electronic devices of various kinds are well known. Such electronic devices can electronic signals between circuits or over devices to pass information or trigger operation of various elements. For example, modern automobiles include a wide variety of electronically controlled devices disposed throughout the vehicle. Such devices can send signals between each other and/or to the vehicle's central computer for processing. To send such signals, switches transmit or block such signals to facilitate orderly communication. For example, a transmission gate or analog switch can control passing of an incoming signal on to other devices or circuit elements. In one state, the transmission gate blocks the signal, and in another state, the transmission gate passes a signal at its input to its output.

One known approach to handling this application is illustrated in FIG. 1, which illustrates a circuit 10 including a PMOS transistor 12 connected to an NMOS transistor 14. The circuit 10 is controlled by a voltage to the respective gates of the two transistors 12 and 14. A first voltage opens both transistors 12 and 14 to allow a signal at the input to pass to the output, and a second voltage closes both transistors 12 and 14 to block any signals from passing between the input and output.

Such a standard transmission gate has various disadvantages. For example, the input signal can be clamped or cut off when the input signal is too high because the transistors 12 and 14 cannot physically handle such a signal unless specifically designed and built to do so. Also, back-feed signals can travel from the input to the output due to a parasitic diode effect on the PMOS transistor of the gate. Such a transmission gate can also fail to pass an input signal without significant signal degradation or change when the input signal varies over a wide range or when power to control the transmission gate is in flux.

SUMMARY

Generally speaking and pursuant to these various embodiments, a transmission gate is provided that self-biases its transistors to provide a constant gate biasing. The constant gate biasing provides a consistent path for an input signal to be cleanly passed to the gate's output and protects the transistors' gate oxide in cases of high input signals. By one such approach, an array of matched transistors are arranged to be biased by a voltage input node with a current source configured to provide a bias current. The current source in one such example is configured to provide a bias current across individual transistors of the array of matched transistors. A current sink is configured to sink the bias current across the individual transistors of the array of matched transistors to set a bias voltage at a voltage input node to a multiple of a gate-to-source voltage for the individual transistors of the array of matched transistors. A different set of transistors from the individual transistors of the array of matched transistors is configured to provide a signal path for an analog input signal received at one of the different set of transistors to be output as an analog output signal from another one of the different set of transistors. The different set of transistors is self-biased at a multiple of a gate-to-source voltage for the different set of transistors.

So configured, a wide common mode range can be accommodated because the input signal will not adversely affect the bias signals or readily damage the transistors of the transmission gate. The transmission gate topology permits constant gate-to-source voltage biasing to keep the drain-to-source resistance of the different set of transistors constant through process variation. These and other benefits may become clear upon making a thorough review and study of the following detailed description.

BRIEF DESCRIPTION OF THE DRAWINGS

The above needs are at least partially met through provision of the wide common mode range transmission gate described in the following detailed description and particularly when studied in conjunction with the drawings wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 2:
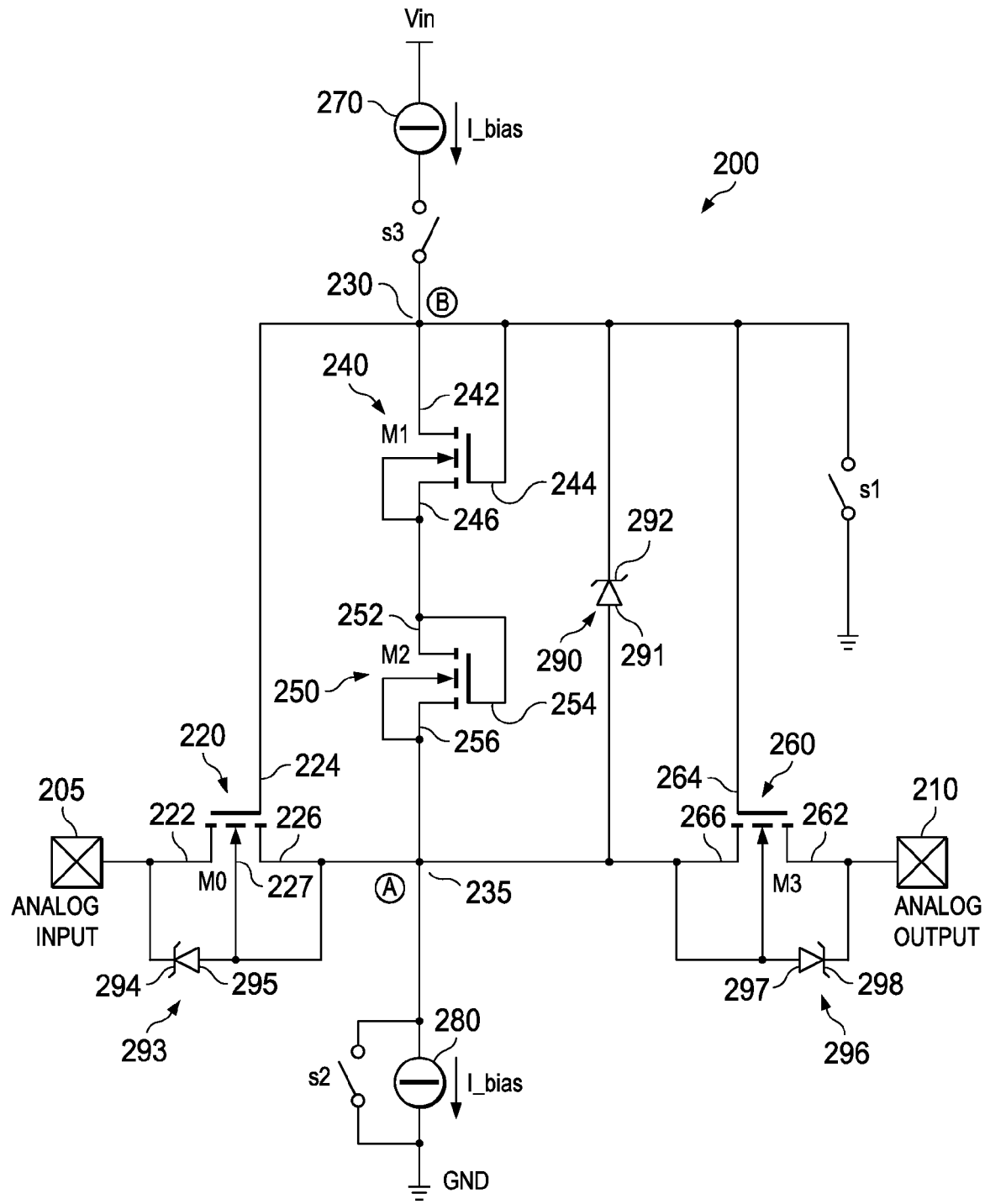
FIG. 2 comprises a circuit diagram of an example transmission gate as configured in accordance with various embodiments of the invention.

Referring now to the drawings, and in particular, to FIG. 2, an illustrative apparatus 200 that is compatible with many of these teachings, will now be presented. In the example of FIG. 2, the apparatus 200 includes an analog input line 205 and an analog output line 210. A first transistor 220 includes a first drain 222 electrically connected to the analog input line 205, a first gate 224 electrically connected to a voltage input node 230, and a first source 226 electrically connected to an analog signal node 235. The apparatus 200 further includes a second transistor 240 and a third transistor 250. The second transistor 240 and the third transistor 250 are electrically connected between the voltage input node 230 and the analog signal node 235. In the illustrated example, the second transistor has a second drain 242 and a second gate 244 electrically connected to the voltage input node 230. The third transistor 250 has a third drain 252 and a third gate 254, both electrically connected to a second source 246 of the second transistor 240. The third transistor 250 also has a third source 256 electrically connected to the analog signal node 235. The fourth transistor 260 includes a fourth source 266 electrically connected to the analog signal node 235. A fourth gate 264 electrically connected to the analog signal node 230, and a fourth drain 262 electrically connected to the analog output line 210.

A current source 270 is electrically connected to provide a bias current into the voltage input node 230. A current sink 280 is electrically connected to sink current from the analog signal node 235. The current sink is configured to sink current used to bias the second transistor 240 and the third transistor 250 to allow the analog signal nodes 235 signal to be determined by a signal received by the analog input line 205.

By one approach, the first transistor 220, the second transistor 240, the third transistor 250, and the fourth transistor 260 are high voltage matched transistors. The phrase "matched transistors" is known in the art to mean two or more transistors of the same type such as bipolar NPN transistors or two enhancement N-type MOSFETS, which by either manufacture, selection, or both have similar characteristics. The closer the characteristics the better the match. One approach to making matched transistors is to make them together or next to each other on a single die during the transistor manufacturing process. With the current sink 280 removing the current from the current source 270 that is used to bypass the second transistor 240 and the third transistor 250 which are matched transistors, the signal path between the analog input line 205 and the analog output line 210 is not disturbed by the biasing. So configured, the analog signal node 235 is determined by the input analog signal at the analog input line 205, which in turn forces the voltage input node 230 to be self-biased to twice the gate-to-source bias voltage for the second transistor 240 and the third transistor 250 no matter what the input analog signal is. As the input analog signal moves up and down, the gate-to-source voltage of the first transistor 220 and the fourth transistor 260 will be kept biased to twice the gate-to-source voltage for those transistors because of the current node operation force by the current source 270 and the current sink 280. Such a topology allows constant gate to source voltage that will not compromise the integrity of the gate oxide of the transistors regardless of the analog input voltage.

The illustrative example of FIG. 2 includes further elements that facilitate operation of the apparatus 200. For instance, the apparatus 200 further includes a diode 290 having an anode 291 electrically connected to the analog signal node 235 and having a cathode 292 electrically connected to the voltage input node 230. This diode 290 helps to suppress transient events within the circuit. Additional diodes can be connected to various ones of the transistors. For example, a first transistor diode 293 can have an anode 294 electrically connected to the first source 226 and a first body 227 of the first transistor 220 and a cathode 295 electrically connected to the first drain 226. Similarly, a fourth transistor diode 296 can have an anode 297 electrically connected to the fourth source 266 and a fourth body 267 of the fourth transistor 260 and a cathode 298 electrically connected to the fourth drain 262. These diodes 293 and 296 facilitate the operation of the associated transistors 220 and 260.

Switches S1, S2, and S3 are disposed at various points throughout the circuit to selectively open or close the signal path between the analog input line 205 and the analog output line 210. For example, to allow a signal to pass through the circuit 200, switch S2 opens to allow the current sink 280 to operate, and switch S3 closes to allow the current source 270 to pass current into the voltage input node 230. Switch S1 is open so that the signal at the voltage input node 230 is passed to the various other elements of the circuit 200 instead of to ground. To turn off the circuit 200 so that a signal will not pass to the analog output line 210, the switches S1, S2, and S3 assume their respective opposite positions. Thus, switch S1 closes to ground the voltage input node 230, switch S2 closes to ground the analog signal node 235 around the current sink 280, and switch S3 opens to cut the circuit 200 off from the input voltage $V_{in}$, and the current source 270. With no biasing voltage or current, the transistors 220, 240, 250, and 260 turn off, not allowing a signal to pass between their respective drains and sources. Moreover, whatever signal is left at the voltage input node 230 and analog signal node 235 is pulled to ground to further assure no passage of signal to the analog output line 210. The switches S1, S2, and S3 are controlled by a separate controller (not shown) using methods known in the art. One skilled in the art could also envision other designs to shut the transmission gate off on command.

FIG. 2 illustrates just one example approach. Generally speaking, a transmission gate circuit according to these teachings will include a self-biased gate drive configured to provide constant gate biasing to an array of matched transistors. The constant gate biasing need not be perfectly "constant," but only need to be within a given small range within the capabilities of such circuits. A current source provides a bias current across individual transistors of the array of matched transistors. FIG. 2 illustrates N-type MOSFET transistors 240 and 260 as the individual transistors, although a different number or type of transistors can be used. A current sink sinks the bias current across the individual transistors of the array of matched transistors to set a bias voltage at a voltage input node to a multiple of a gate-to-source voltage for the individual transistors of the array of matched transistors. A different set of transistors from the individual transistors of the array of matched transistors provide a signal path for an analog input signal received at one of the different set of transistors to be output as an analog output signal from another one of the different set of transistors. In the example of FIG. 2, the transistors 220 and 260 represent the different set of N-type MOSFET transistors from the array of matched transistors, although a different number or type of transistors can be used. This different set of transistors is biased at a multiple of a gate-to-source voltage for the different set of transistors.

Figure 1:
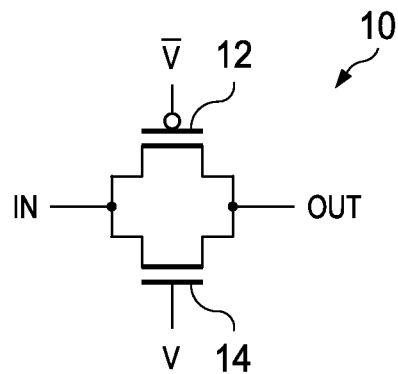
FIG. 1 comprises a circuit diagram for an example prior transmission gate.
Figure 3:
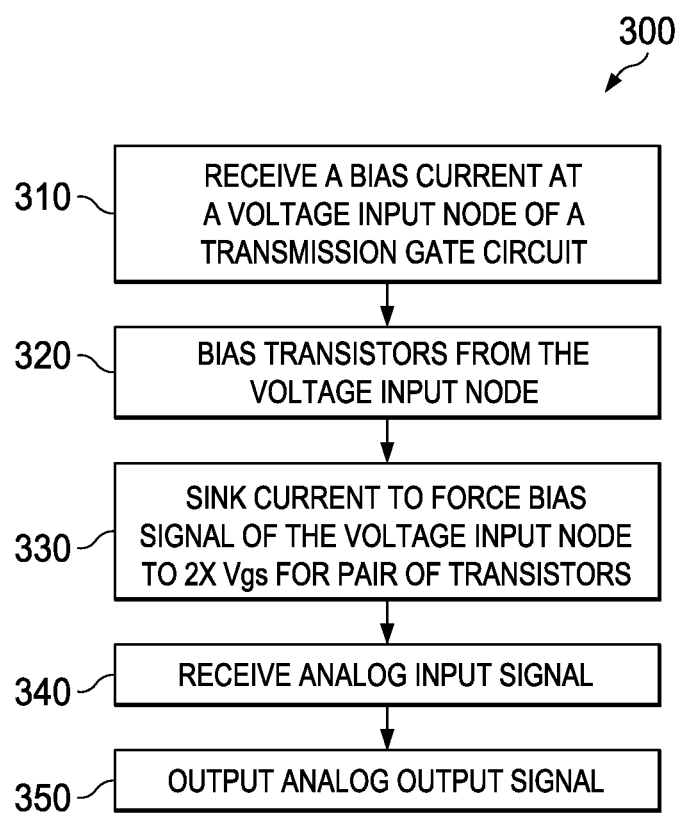
FIG. 3 comprises a flow diagram of a method of operation in accordance with various embodiments of the invention.

Turning to FIG. 3, an example method of operation of such a circuit will be described. The illustrated method 300 includes receiving 305 a bias current at a voltage input node of a transmission gate circuit. The transistors are biased 320 from the voltage input node. For instance, a first transistor, a second transistor, and a fourth transistor, from the voltage input node, and a third transistor is biased from current from the second source of the second transistor. The method 300 further includes sinking 330 current from an analog signal node electrically connected to a first source of the first transistor, a third source of the third transistor, and a fourth drain of the fourth transistor to force the voltage input node to a bias signal of twice a gate-to-source voltage for the second transistor and the third transistor. This approach also biases the first transistor and the fourth transistor to twice a gate-to-source voltage for the first transistor and the fourth transistor. An analog input signal is received 340 at a first drain of the first transistor, and an analog output signal corresponding to the analog input signal is output 350 at an analog output line electrically connected to a fourth drain of the fourth transistor. Because the transistors are self-biased and the biasing current is sinked, the analog signal is not distorted during transmission through the transmission gate.

Figure 4:
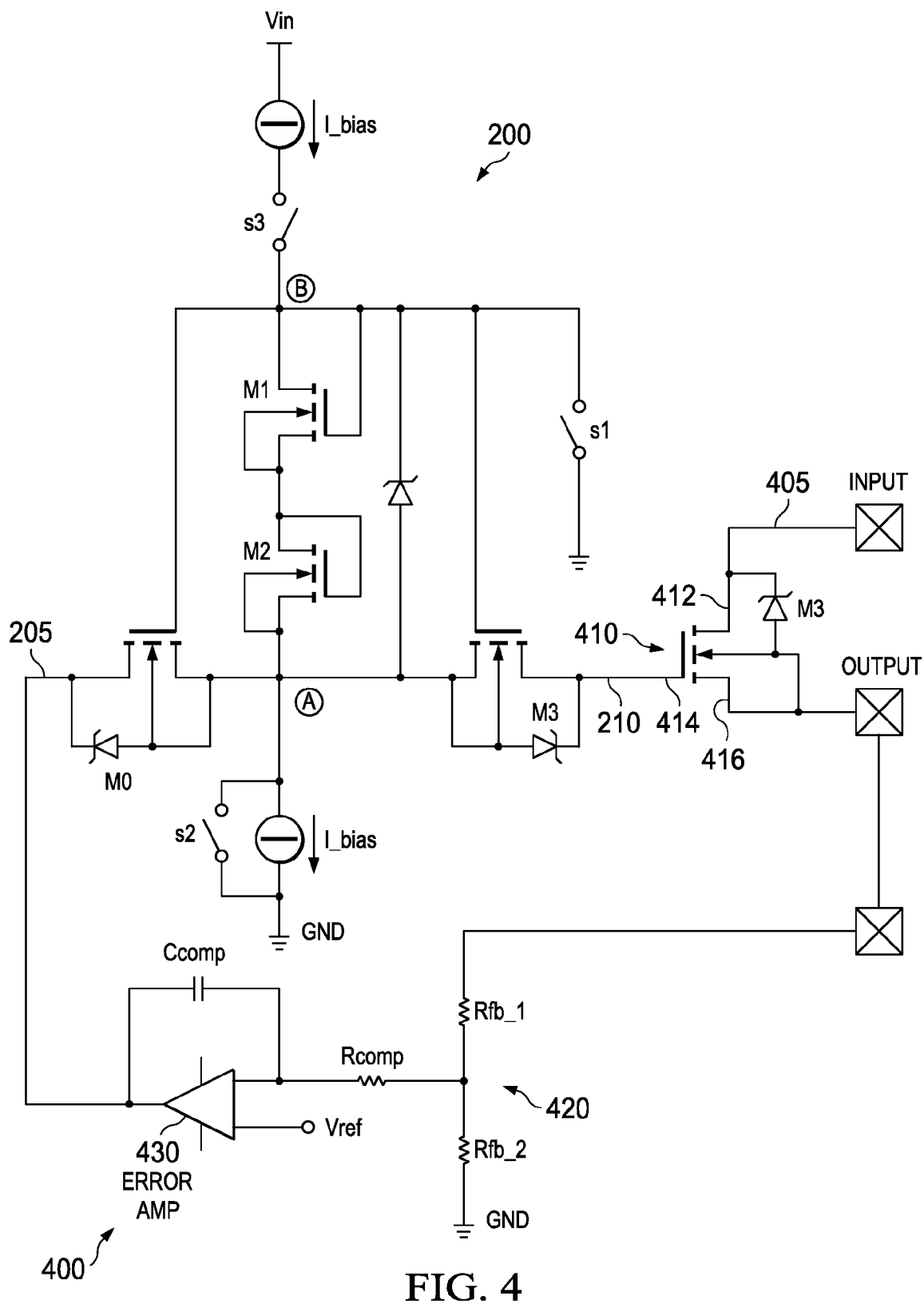
FIG. 4 comprises a circuit diagram of an example transmission gate incorporated into a low dropout regulator circuit as configured in accordance with various embodiments of the invention.

A transmission gate according to these teachings can be incorporated into a variety of applications. In one such example illustrated in FIG. 4, the transmission gate circuit 200 of FIG. 2 is incorporated into a low dropout regulator circuit 400. The low dropout regulator circuitry 400 includes a fifth transistor 410 having a fifth drain 412 electrically connected to a low dropout regulator input line 405, a fifth gate 414 electrically connected to the analog output line 210, and a fifth source 416 electrically connected to a low dropout regulator output line 410 and a voltage divider 420. The voltage divider 420 steps down the output of the low dropout regulator circuit 400 for analysis to provide feedback to control operation of the circuit 400. An error amplifier circuit 430 is electrically connected to the voltage divider 420 and configured to compare a signal from the voltage divider 420 to a reference voltage $V_{ref}$ and to output a feedback signal to the analog input line 205 of the transmission gate circuit 200.

Figure 5:
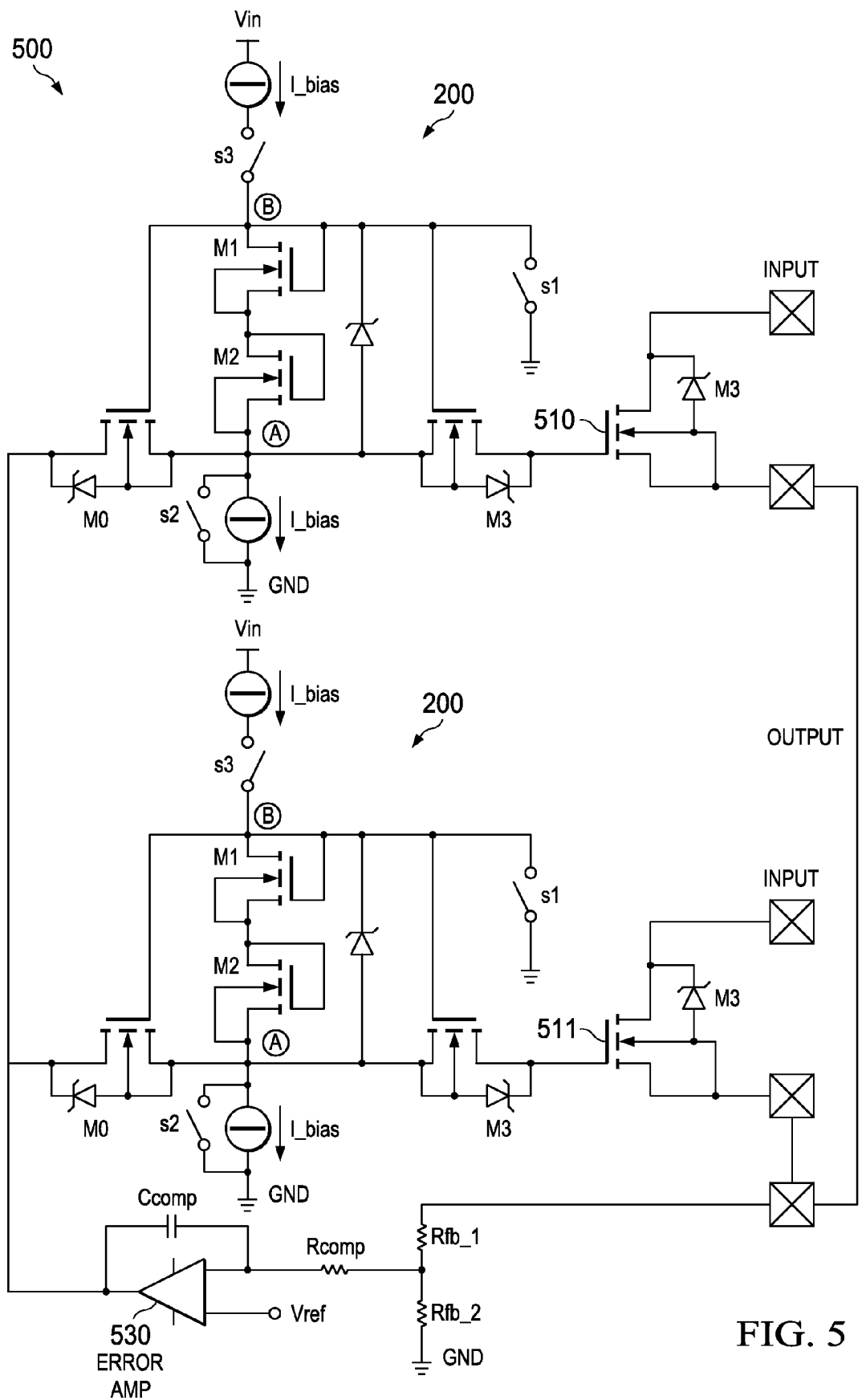
FIG. 5 comprises a circuit diagram of an example low dropout regulator circuit incorporating two transmission gates as configured in accordance with various embodiments of the invention.

Such a configuration provides flexibility in the design of low dropout regulators to use multiple power FET based transmission gates in parallel to increase the current capacity of the low dropout regulator. An example configuration using two transmission gates in parallel is illustrated in FIG. 5. In this approach to a low dropout regulator 500, two transmission gates 200 have their input lines electrically connected to the output of the error amplifier 530. The analog output lines of the two transmission gates 200 are electrically connected to respective transistors 510 and 511 in a manner similar to that described above with respect to FIG. 4. The output lines from the two transistors 510 and 511 are electrically connected to provide a single output from the low dropout regulator 500. By having multiple transmission gates available, more current can be handled by the low dropout regulator 500 before damage to the individual circuit elements may occur.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. An apparatus comprising:
   an analog input line;
   an analog output line;
   a first transistor having a first drain electrically connected to the analog input line, a first gate electrically connected to a voltage input node, and a first source electrically connected to an analog signal node;
   a second transistor;
   a third transistor;
   wherein the second transistor and the third transistor are electrically connected between the voltage input node and the analog signal node wherein:
   the second transistor has a second drain and a second gate electrically connected to the voltage input node, and
   the third transistor has a third drain and third gate both electrically connected to a second source of the second transistor and a third source electrically connected to the analog signal node;
   a fourth transistor having a fourth source electrically connected to the analog signal node, a fourth gate electrically connected to the voltage input node, and a fourth drain electrically connected to the analog output line;
   a current source electrically connected to provide a bias current into the voltage input node;
   a current sink electrically connected to sink current from the analog signal node.

2. The apparatus of claim 1 further comprising a diode having an anode electrically connected to the analog signal node and having a cathode electrically connected to the voltage input node.

3. The apparatus of claim 1 further comprising:
   a first transistor diode having an anode electrically connected to the first source and a first body of the first transistor and a cathode electrically connected to the first drain; and
   a fourth transistor diode having an anode electrically connected to the fourth source and a fourth body of the fourth transistor and a cathode electrically connected to the fourth drain.

4. The apparatus of claim 1 wherein the first transistor, the second transistor, the third transistor, and the fourth transistor are high voltage matched transistors.

5. The apparatus of claim 1 wherein the current sink is configured to sink current used to bias the second transistor and the third transistor to allow the analog signal node's signal to be determined by a signal received by the analog input line.

6. The apparatus of claim 1 further comprising low dropout regulator circuitry comprising:
   a fifth transistor having a fifth drain electrically connected to a low dropout regulator input line, a fifth gate electrically connected to the analog output line, and a fifth source electrically connected to a low dropout regulator output line and a voltage divider;
   an error amplifier circuit electrically connected to the voltage divider and configured to compare a signal from the voltage divider to a reference voltage and to output a feedback signal to the analog input line.

7. A transmission gate circuit apparatus comprising:
   a self-biased gate drive configured to provide constant gate biasing to an array of matched transistors;
   wherein the self-biased gate drive includes:
   a current source configured to provide a bias current across individual transistors of the array of matched transistors;
   a current sink configured to sink the bias current across the individual transistors of the array of matched transistors to set a bias voltage at a voltage input node to a multiple of a gate-to-source voltage for the individual transistors of the array of matched transistors;
   a different set of transistors from the individual transistors of the array of matched transistors configured to provide a signal path for an analog input signal received at one of the different set of transistors to be output as an analog output signal from another one of the different set of transistors to be biased at a multiple of a gate-to-source voltage for the different set of transistors,
   wherein:
   the individual transistors of the array of matched transistors include a second transistor and third transistor;
   the different set of transistors includes a first transistor and a fourth transistor;
   the first transistor has a first drain electrically connected to an analog input line configured to receive the analog input signal, a first gate electrically connected to the voltage input node, and a first source electrically connected to an analog signal node;
   the second transistor and the third transistor are electrically connected between the voltage input node and the analog signal node wherein:

the second transistor has a second drain and a second gate electrically connected to the voltage input node, and the third transistor has a third drain and third gate both electrically connected to a second source of the second transistor and a third source electrically connected to the analog signal node;

a fourth transistor having a fourth source electrically connected to the analog signal node, a fourth gate electrically connected to the voltage input node, and a fourth drain electrically connected to the analog output line.

8. The transmission gate circuit apparatus of claim 7 further comprising:

a first transistor diode having an anode electrically connected to the first source and a first body of the first transistor and a cathode electrically connected to the first drain; and a fourth transistor diode having an anode electrically connected to the fourth source and a fourth body of the fourth transistor and a cathode electrically connected to the fourth drain.

9. The apparatus of claim 7 further comprising low dropout regulator circuitry comprising:

a fifth transistor electrically connected to a low dropout regulator input line, to receive an analog output signal from the self-biased gate drive, and to a low dropout regulator output line with a voltage divider;

an error amplifier circuit electrically connected to the voltage divider and configured to compare a signal from the voltage divider to a reference voltage and to output a feedback signal to the self-biased gate drive.

* * * * *